(12) United States Patent
Arai

(10) Patent No.: US 9,954,503 B2
(45) Date of Patent: Apr. 24, 2018

(54) DIFFERENTIAL AMPLIFICATION CIRCUIT AND SEMICONDUCTOR INTEGRATED CIRCUIT

(71) Applicant: SOCIONEXT INC., Yokohama-shi, Kanagawa (JP)

(72) Inventor: Tomoyuki Arai, Kokubunji (JP)

(73) Assignee: SOCIONEXT INC., Yokohama (JP)

( * ) Notice: Subject to any disclaimer, the term of this patent is extended or adjusted under 35 U.S.C. 154(b) by 350 days.

(21) Appl. No.: 14/626,491

(22) Filed: Feb. 19, 2015

(65) Prior Publication Data
US 2015/0280666 A1    Oct. 1, 2015

(30) Foreign Application Priority Data

Mar. 31, 2014 (JP) .................. 2014-072599

(51) Int. Cl.
*H03G 1/00* (2006.01)
*H03F 3/45* (2006.01)
*H03G 3/00* (2006.01)

(52) U.S. Cl.
CPC ....... *H03G 1/0029* (2013.01); *H03F 3/45197* (2013.01); *H03G 1/0088* (2013.01); *H03G 3/001* (2013.01); *H03F 2203/45494* (2013.01); *H03F 2203/45496* (2013.01); *H03F 2203/45504* (2013.01); *H03F 2203/45702* (2013.01); *H03G 2201/40* (2013.01)

(58) Field of Classification Search
USPC ................................. 330/252–261, 283, 304
See application file for complete search history.

(56) References Cited

U.S. PATENT DOCUMENTS

| | | | | |
|---|---|---|---|---|
| 7,598,811 B2* | 10/2009 | Cao | ...................... | H03F 3/45183 330/254 |
| 7,804,356 B2* | 9/2010 | Gomez | .................. | H03G 3/001 330/140 |
| 7,956,687 B2* | 6/2011 | Vakilian | .................. | H03F 1/086 330/254 |
| 2010/0201448 A1 | 8/2010 | Sasaki | | |
| 2013/0049868 A1 | 2/2013 | Parikh | | |

FOREIGN PATENT DOCUMENTS

| | | |
|---|---|---|
| JP | 2003-273674 A | 9/2003 |
| JP | 2010-183453 A | 8/2010 |
| JP | 2013-046417 A | 3/2013 |

* cited by examiner

*Primary Examiner* — Hieu Nguyen
(74) *Attorney, Agent, or Firm* — Arent Fox LLP

(57) ABSTRACT

A differential amplification circuit includes: a first transistor and a second transistor of a differential pair; first and second loads; current sources; and a resistor circuit, wherein the resistor circuit includes: a coarse adjustment part and a fine adjustment part, one of the coarse adjustment part and the fine adjustment part includes a first lateral adjustment part and a second lateral adjustment part which have the same configuration, the first lateral adjustment part and the second lateral adjustment part are connected symmetrically to both sides of a central adjustment part, and the central adjustment part has a circuit configuration symmetrical with respect to two connection nodes with the first lateral adjustment part and the second lateral adjustment part.

14 Claims, 7 Drawing Sheets

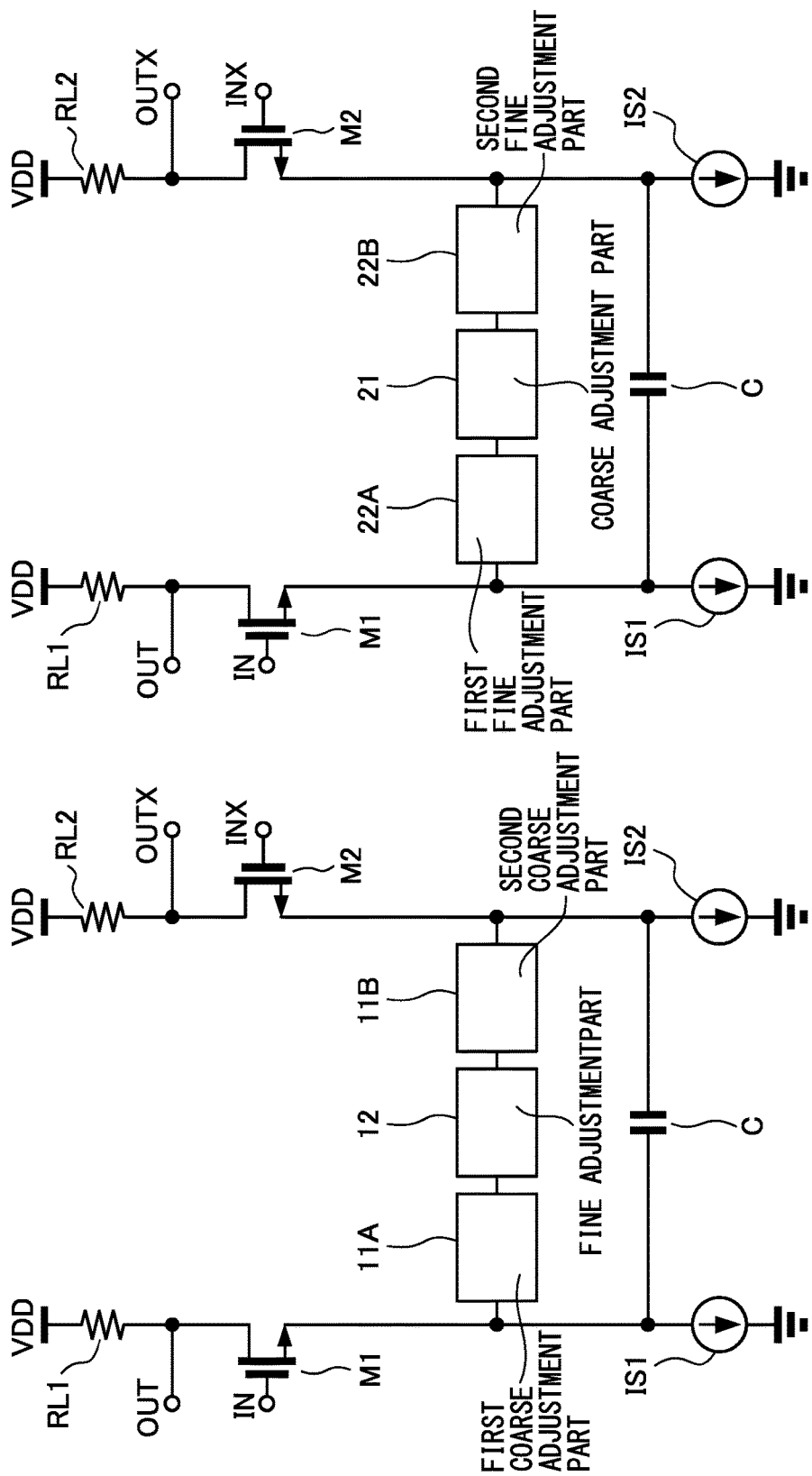

FIG. 4A

| SW | Runit no. |
|---|---|
| 1 | 0.9 |
| 2 | 10 |
| 3 | 9 |
| 4 | 8 |
| 5 | 7 |
| 6 | 1.7 |
| 7 | 20 |
| 8 | 15 |
| 9 | 14 |
| 10 | 13 |
| 11 | 1 |
| 12 | 1 |
| 13 | 0.7 |
| 14 | 0 |

FIG. 4B

| Code/Bit | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 | | | | | | 1 | | | | | 1 | | | |
| 2 | | | | | | 1 | 1 | | | | 1 | | | |
| 3 | | | | | | 1 | 1 | 1 | | | 1 | | | |
| 4 | | | | | | 1 | 1 | 1 | 1 | | 1 | | | |
| 5 | | | | | | 1 | 1 | 1 | 1 | 1 | 1 | | | |
| 6 | | | | | | 1 | | | | | 1 | | 1 | |
| 7 | | | | | | 1 | 1 | | | | 1 | | 1 | |
| 8 | | | | | | 1 | 1 | 1 | | | 1 | | 1 | |
| 9 | | | | | | 1 | 1 | 1 | 1 | | 1 | | 1 | |
| 10 | | | | | | 1 | 1 | 1 | 1 | 1 | 1 | | 1 | |
| 11 | 1 | | | | | | | | | | 1 | 1 | | |
| 12 | 1 | 1 | | | | | | | | | 1 | 1 | | |
| 13 | 1 | 1 | 1 | | | | | | | | 1 | 1 | | |
| 14 | 1 | 1 | 1 | 1 | | | | | | | 1 | 1 | | |
| 15 | 1 | 1 | 1 | 1 | 1 | | | | | | 1 | 1 | | |
| 16 | 1 | | | | | | | | | | | | | 1 |
| 17 | 1 | 1 | | | | | | | | | | | | 1 |
| 18 | 1 | 1 | 1 | | | | | | | | | | | 1 |
| 19 | 1 | 1 | 1 | 1 | | | | | | | | | | 1 |
| 20 | 1 | 1 | 1 | 1 | 1 | | | | | | | | | 1 |

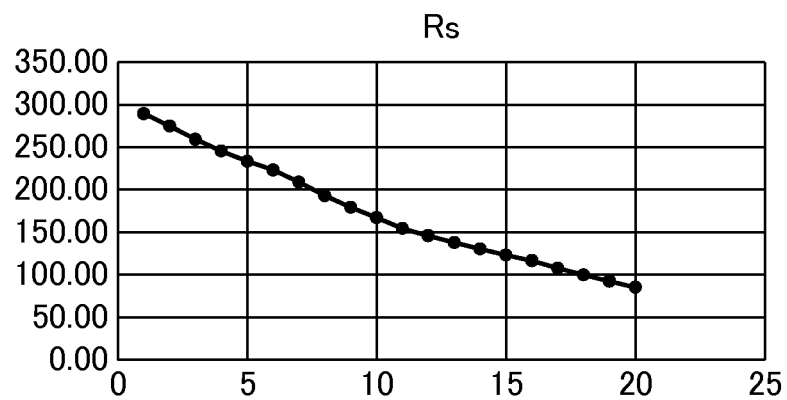
FIG. 5A
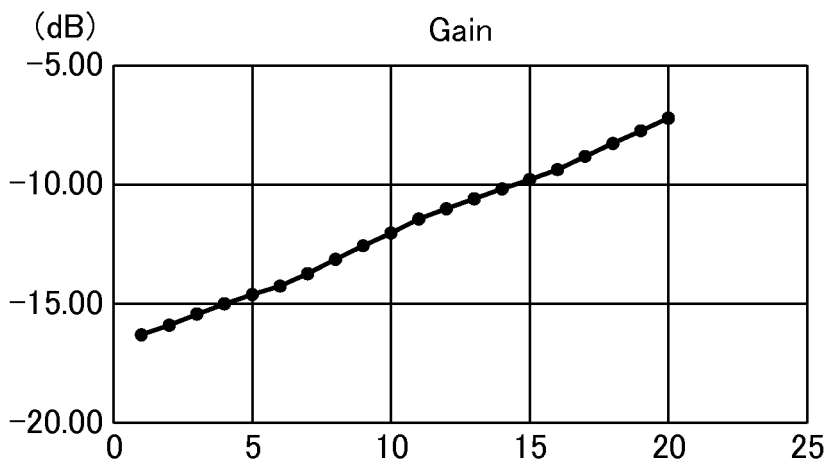
FIG. 5B
FIG. 6
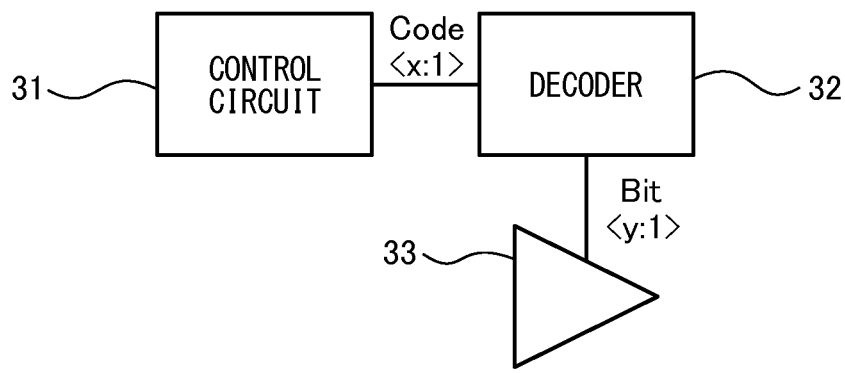

DIFFERENTIAL AMPLIFICATION CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2014-072599, filed on Mar. 31, 2014, the entire contents of which are incorporated herein by reference.

FIELD

The present invention relates to a differential amplification circuit and a semiconductor integrated circuit.

BACKGROUND

A differential amplification circuit is used widely in various kinds of fields and a gain-variable differential amplification circuit is used for a certain purpose. For example, the frequency characteristics of the reception circuit of the differential amplification circuit that is used in a high-speed data reception circuit change by changing the gain. Because of this, the frequency characteristics are optimized by evaluating the error rate of received data and the eye pattern of a received signal and by adjusting the gain of the differential amplification circuit based on the evaluation results.

Hitherto, the gain of the gain-variable differential amplification circuit is changed generally by changing the resistance value of the resistor within the differential amplification circuit and desirably, the gain can be adjusted in accordance with a digital code from the viewpoint of usability. Consequently, the resistor within the differential amplification circuit is turned into a variable resistor in which a plurality of adjustment units including a switch and a resistor connected in series is connected in parallel, then gain adjustment is made by adjusting the resistance value by sequentially varying the number of switches that are turned on (brought into conduction) of the plurality of adjustment units.

Desirably, the gain-variable differential amplification circuit whose gain is set in accordance with a digital code has a wide adjustment range and at the same time, the gain changes in equal steps, i.e., changes linearly at fixed dB intervals in accordance with the value of the digital code. It is known that the gain of the differential amplification circuit changes in accordance with a predetermined expression. Consequently, the resistance values of a plurality of adjustment units are set and the number of switches that are turned on of the plurality of adjustment units is controlled in accordance with the value of the digital code so that the gain changes linearly in equal steps in accordance with the expression as the number of switches that are turned on is increased. Due to this, a differential amplification circuit whose gain changes linearly in equal steps in accordance with the value of the digital code is implemented. In this case, the resistance value of the adjustment unit is determined in correspondence to an amount of change in gain by which the gain is changed in accordance with the value of the digital code, and therefore, it is possible to determine the resistance value with ease.

In the above-described differential amplification circuit, as the value of the digital code changes by one, the number of switches that are turned on changes in order and, for example, when the gain reaches its maximum, all of the switches are turned on. In other words, when the gain is changed by one step, one resistor is connected in parallel, and therefore, one of the values of the digital code changes. Because of this, the differential amplification circuit requires the same number of switches as the total number of necessary steps of the gain.

The gain-variable differential amplification circuit is required to reduce the area of the circuit and if switches in the same number as the total number of steps of the gain, i.e., if adjustment units in the same number as the total number of steps of the gain are provided, the area of the circuit increases. Because of this, it is required to implement a comparatively wide adjustment range and small adjustment intervals (step widths) with a small number of switches in the gain-variable differential amplification circuit.

In the case where the resistance value, etc., is adjusted stepwise, implementing a comparatively wide adjustment range and small adjustment intervals with a small number of switches by combining coarse adjustment and fine adjustment is known. Consequently, it is easy to adjust the resistance by combining coarse adjustment and fine adjustment also in the above-described gain-variable differential amplification circuit.

RELATED DOCUMENTS

[Patent Document 1] Japanese Laid Open Patent Document No. 2013-046417
[Patent Document 2] Japanese Laid Open Patent Document No. 2010-183453
[Patent Document 3] Japanese Laid Open Patent Document No. 2003-273674

SUMMARY

According to a first aspect, a differential amplification circuit includes: a first transistor and a second transistor which form a differential pair; a first load and a second load which are connected between the drains of the first transistor and the second transistor, and one of power source lines, respectively; current sources which are connected between the sources of the first transistor and the second transistor, and the other of the power source lines, respectively; and a resistor circuit which is connected between the sources of the first transistor and the second transistor, wherein the resistor circuit includes: a coarse adjustment part configured to change a resistance value of the resistor circuit in intervals equal to or greater than a first value; and a fine adjustment part configured to change the resistance value of the resistor circuit in intervals equal to or less than a second value, the second value being smaller than the first value, one of the coarse adjustment part and the fine adjustment part includes a first lateral adjustment part and a second lateral adjustment part which have the same circuit configuration, the first lateral adjustment part and the second lateral adjustment part are connected symmetrically to both sides of a central adjustment part, and are connected to the sources of the first transistor and the second transistor, respectively, the central adjustment part being the other of the coarse adjustment part and the fine adjustment part and at the same time, and the central adjustment part has a circuit configuration symmetrical with respect to two connection nodes with the first lateral adjustment part and the second lateral adjustment part.

According to a second aspect, a semiconductor integrated circuit includes: a differential amplification circuit, the gain of which changes in accordance with control data; a control circuit configured to output a gain adjustment code of the differential amplification circuit; and a decoder configured to convert the gain adjustment code into the control data and to apply the control data to the differential amplification circuit, the differential amplification circuit includes: a first transistor and a second transistor which form a differential pair; a first load and a second load which are connected between the drains of the first transistor and the second transistor, and one of power source lines, respectively; current sources which are connected between the sources of the first transistor and the second transistor, and the other of the power source lines, respectively; and a resistor circuit which is connected between the sources of the first transistor and the second transistor, wherein the resistor circuit includes: a coarse adjustment part configured to change a resistance value of the resistor circuit in intervals equal to or greater than a first value; and a fine adjustment part configured to change the resistance value of the resistor circuit in intervals equal to or less than a second value, the second value being smaller than the first value, one of the coarse adjustment part and the fine adjustment part includes a first lateral adjustment part and a second lateral adjustment part which have the same circuit configuration, the first lateral adjustment part and the second lateral adjustment part are connected symmetrically to both sides of a central adjustment part, and are connected to the sources of the first transistor and the second transistor, respectively, the central adjustment part being the other of the coarse adjustment part and the fine adjustment part and at the same time, and the central adjustment part has a circuit configuration symmetrical with respect to two connection nodes with the first lateral adjustment part and the second lateral adjustment part.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 2A and FIG. 2B are diagrams illustrating two basic circuit configurations of the gain-variable differential amplification circuit of the embodiment;

FIG. 4A and FIG. 4B are diagrams illustrating ratios of the resistance value of each resistor and on/off selection of the switches in accordance with the gain adjustment code in the gain-variable differential amplification circuit of the first embodiment, and FIG. 4A illustrates ratios of the resistance value and FIG. 4B illustrates an on/off relationship between the gain adjustment code and the switches;

FIG. 5A and FIG. 5B are diagrams illustrating $R_s$ and the change in the gain of the differential amplification circuit in the case where the resistance ratios illustrated in FIG. 4A and the switch on/off for the control data illustrated in FIG. 4B are applied to the gain-variable differential amplification circuit of the first embodiment;

FIG. 6 is a diagram illustrating a circuit configuration of a semiconductor integrated circuit which includes the gain-variable differential amplification circuit of the first embodiment and which performs gain control;

DESCRIPTION OF EMBODIMENTS

Before explaining embodiments, a general gain-variable differential amplification circuit will be explained.

Figure 1A:
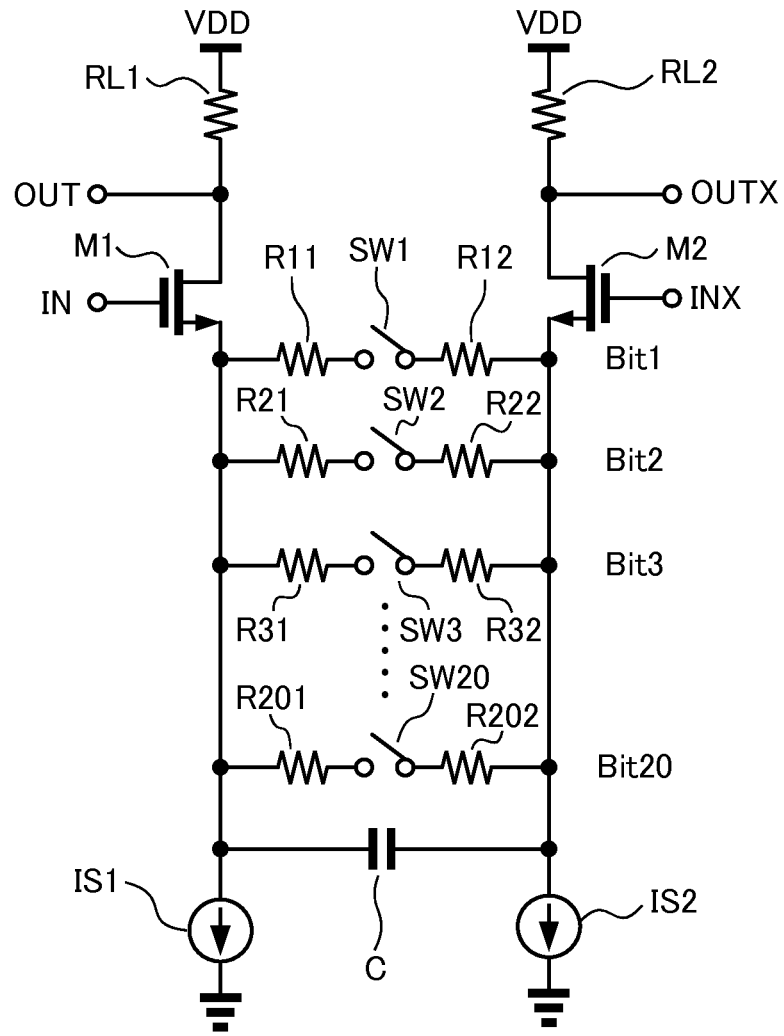
FIG. 1A is a circuit diagram of a general gain-variable differential amplification circuit.
Figure 1B:
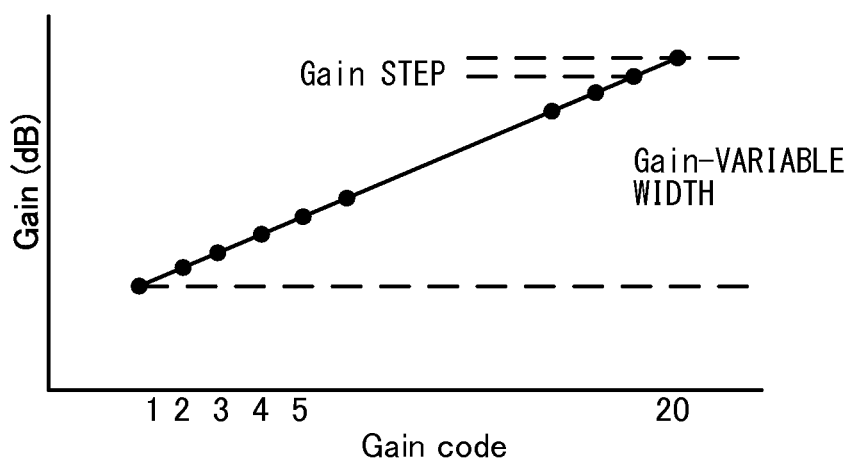
FIG. 1B is a diagram illustrating an example of a change in gain (dB) in accordance with a digital code (gain code)

FIG. 1A is a circuit diagram of a general gain-variable differential amplification circuit and FIG. 1B is a diagram illustrating an example of a change in gain (dB) in accordance with a digital code (gain code).

The gain-variable differential amplification circuit illustrated in FIG. 1A has a first transistor M1, a second transistor M2, load resistors RL1 and RL2, a first current source IS1, a second current source IS2, a capacitor C and a resistor part. The first transistor M1 and the second transistor M2 form a differential pair. The load resistor RL1 is connected between the drain of M1 and VDD, which is one of power source lines. The load resistor RL2 is connected between the drain of M2 and VDD. The first current source IS1 is connected between the source of M1 and GND, which is the other power source line. The second current source IS2 is connected between the source of M2 and GND. It may also be possible to form the first current source IS1 and the second current source IS2 be shared by connecting the source of M1 and the source of M2 and by connecting both to the connection node. The capacitor C is connected between the source of M1 and the source of M2. The capacitor C is implemented by a parasitic capacitor, etc., and there is a case where a specific capacitor element is not connected. The resistor part is connected between the source of M1 and the source of M2 and has 20 adjustment units connected in parallel. A differential input signal IN is input to the gate of M1 and a differential input signal INX is input to the gate of M2, and differential output signals OUT and OUTX are output from the differential output nodes.

The respective 20 adjustment units have respective switches SW1 to SW20, and respective resistors R11 to R201 and respective resistors R12 to R202 connected to both sides of the switches. The other ends of the resistors R11 to R201 are connected to the source of M1 and the other ends of the resistors R12 to R202 are connected to the source of M2. The resistor part can take connection states in 20 steps, i.e., a state where SW1 is connected, a state where SW2 is further connected, a state where SW3 is further connected, . . . , and a state where SW20 is further connected, i.e., a state where SW1 to SW20 are all connected. Here, data Bit1 to Bit20 of the gain adjustment code relate to the state control of SW1 to SW20 and when Bitn (n: 1 to 20) is "0", the corresponding SWn is turned off (shut off) and when Bitn is "1", the corresponding SWn is turned on (brought into conduction). Bit1 to Bit20 change from a state where Bit1="1" and Bit2 to Bit20 are "0" to a state where Bit2 further changes to "1", and to a state where Bit3 further changes to "1", and finally, to a state where Bit20 further changes to "1", i.e., a state where Bit1 to Bit20 are all "1".

The gain of the differential amplification circuit in FIG. A is expressed by the following expression.

$$\text{Gain} = 20\log\left(\frac{gmR_L}{1+\frac{gmR_S}{2}}\right)$$

In this case, gm is the transconductance of M1 and M2, $R_L$ is the load resistance value of the differential amplification circuit (i.e., the resistance value of RL1 and RL2), and $R_S$ is the effective resistance value of the resistors except for the load resistance value of the differential amplification circuit. In this differential amplification circuit, the gain is controlled by controlling $R_S$ by using Bit1 to Bit20.

Further, the gain-variable differential amplification circuit illustrated in FIG. 1A is designed so that when the state of the switch is changed, the symmetry of the differential pair is maintained by arranging resistors having the same resistance value on both sides of the switch in each adjustment unit.

As described above, the gain that is expressed by the above-described expression is required to change linearly in fixed steps for the change in the value of the gain adjustment code as illustrated in FIG. 1B. Because of this, in the differential amplification circuit in FIG. 1A, control is performed so that, as the data Bit1 to Bit20 of the gain adjustment code increases by one, SW1 to SW20 turn on in order, and thereby the gain changes in fixed dB steps. As described above, at the time of the maximum gain, Bit1 to Bit20 are all "1" and SW1 to SW20 are all in the on state. Consequently, the resistance value of each of the set of R11 and R12, ..., and the set of R201 and R211 is selected so that the difference between the gain that is obtained by substituting the combined resistance of the sets up to a certain set in the above-described expression and the gain that is obtained by substituting the combined resistance of the sets up to the next set in the above-described expression will be the gain difference corresponding to one step width. The difference between resistances that will result in the same value in terms of dB differs between one side and the other side of the gain adjustment range. Because of this, even if a plurality of resistors whose resistance values change by powers of 2 is prepared and a variable resistor whose resistance values change in equal steps by combining the plurality of resistors is applied, the gain does not change in equal steps, and therefore, adjustment units in the number corresponding to the number of steps are provided.

In other words, in the gain-variable differential amplification circuit in FIG. 1A, when changing the gain by one step, one bit is necessary in order to connect one resistor in parallel. Because of this, the gain control of the differential amplification circuit requires bits in the same number as the total number of necessary steps of the gain. In other words, the gain-variable differential amplification circuit in FIG. 1A has the same number of adjustment units (switches) as the total number of steps of the gain.

The gain-variable differential amplification circuit is required to reduce the area of its circuit, and therefore, it is required to prevent an increase in the area of its circuit by decreasing the number of switches, i.e., the number of adjustment units while maintaining the gain adjustment range and the adjustment resolution.

Further, the gain-variable differential amplification circuit is required for an output to change symmetrically with respect to the rise and fall of an input. Because of this, in the case where the connection of the plurality of adjustment units included in the variable resistor is changed, it is also required to maintain the symmetry in the differential amplification circuit.

A gain-variable differential amplification circuit that has taken symmetry into consideration when adjusting the resistance value of a resistor by combining coarse adjustment and fine adjustment is not known.

According to the embodiment, a gain-variable differential amplification circuit is implemented by which a comparatively wide gain adjustment range and small gain adjustment intervals are obtained with a small number of switches and in which the symmetry in the output change is maintained also when the gain changes.

In the embodiment that is explained below, a gain-variable differential amplification circuit by which a comparatively wide gain adjustment range and small gain adjustment intervals are obtained with a small number of switches and in which the symmetry in the output change is maintained also when the gain changes is disclosed.

FIG. 2A and FIG. 2B are diagrams illustrating two basic circuit configurations of the gain-variable differential amplification circuit of the embodiment.

The gain-variable differential amplification circuit illustrated in FIG. 2A has the first transistor M1, the second transistor M2, the load resistors RL1 and RL2, the first current source IS1, the second current source IS2, the capacitor C, and the resistor part. The gain-variable differential amplification circuit illustrated in FIG. 2A is the same as the gain-variable differential amplification circuit in FIG. 1A except for the resistor part, and therefore, explanation is omitted.

In the gain-variable differential amplification circuit illustrated in FIG. 2A, the resistor part is a resistor circuit including a plurality of resistors and has a first coarse adjustment part 11A, a second coarse adjustment part 11B, and a fine adjustment part 12. The fine adjustment part 12, the first coarse adjustment part 11A, and the second coarse adjustment part 11B are connected in series and the resistance value of the resistor part is the sum of the resistance values of the fine adjustment part 12, the first coarse adjustment part 11A, and the second coarse adjustment part 11B.

The fine adjustment part 12 has a circuit configuration symmetrical with respect to the two connection nodes with the first coarse adjustment part 11A and the second coarse adjustment part 11B. In other words, the circuit configuration of the fine adjustment part 12 is designed so that the circuit configuration when viewed from the connection node with the first coarse adjustment part 11A is the same as that when viewed from the connection node with the second coarse adjustment part 11B. The first coarse adjustment part 11A and the second coarse adjustment part 11B have the same circuit configuration and are connected symmetrically on both sides of the fine adjustment part 12, and are further connected to the sources of M1 and M2, respectively. The resistance values of the first coarse adjustment part 11A and the second coarse adjustment part 11B are variable and adjustment is made simultaneously for both the parts so as to have the same resistance value. The change in the resistance value, which is the sum of the resistance values of the first coarse adjustment part 11A and the second coarse adjustment part 11B, in one step is equal to or greater than a first value. The resistance value of the fine adjustment part 12 is variable and the change in the resistance value in one step of the fine adjustment part 12 is equal to or less than a second value that is smaller than the first value. The fine adjustment part 12 has a symmetrical circuit configuration, and the first coarse adjustment part 11A and the second coarse adjustment part 11B have the same circuit configuration and are connected symmetrically on both sides of the fine adjustment part 12, and therefore, even if the resistance value of the fine adjustment part 12, the first coarse adjustment part 11A, and the second coarse adjustment part 11B is changed, the symmetrical state with respect to the differential pair is maintained.

The gain-variable differential amplification circuit illustrated in FIG. 2B has a circuit configuration similar to that of the gain-variable differential amplification circuit illustrated in FIG. 2A, but is different in that the resistor part has a coarse adjustment part 21, a first fine adjustment part 22A, and a second fine adjustment part 22B. The coarse adjustment part 21 has a circuit configuration symmetrical with respect to the two connection nodes with the first fine adjustment part 22A and the second fine adjustment part 22B. In other words, the circuit configuration of the coarse adjustment part 21 is designed so that the circuit configuration when viewed from the connection node with the first fine adjustment part 22A is the same as that when viewed from the connection node with the second fine adjustment part 22B. The first fine adjustment part 22A and the second fine adjustment part 22B have the same circuit configuration, and are connected symmetrically on both sides of the coarse adjustment part 21, and are further connected to the sources of M1 and M2, respectively. Because of this, even if the resistance value of the coarse adjustment part 21, the first fine adjustment part 22A, and the second fine adjustment part 22B is changed, the symmetrical state with respect to the differential pair is maintained.

Hereinafter, explanation is given by using the gain-variable differential amplification circuit illustrated in FIG. 2A as an example, but the same explanation will apply to the gain-variable differential amplification circuit illustrated in FIG. 2B.

The change in the resistance value in one step, which is the sum of the resistance values of the first coarse adjustment part 11A and the second coarse adjustment part 11B that are adjusted simultaneously, is equal to or greater than the first value and is greater than the change in the resistance value in one step of the fine adjustment part 12. In other words, the adjustment of the resistance value by the first coarse adjustment part 11A and the second coarse adjustment part 11B is coarse adjustment in which the change in the resistance value in one step is great and the adjustment of the resistance value by the fine adjustment part 12 is fine adjustment in which the change in the resistance value in one step is small. By combining the coarse adjustment and the fine adjustment, it is possible to make adjustment with a wider adjustment range and with a smaller adjustment resolution (adjustment width in one step) even if the number of switches is the same.

Forming an adjustment mechanism by using a coarse adjustment part and a fine adjustment part is known. For example, in a resistance adjustment mechanism to adjust the resistance value, etc., a coarse adjustment part and a fine adjustment part are connected in series, and therefore, the resistance value of the resistance adjustment mechanism is the resistance value, which is the sum of the resistance value of the coarse adjustment part and the resistance value of the fine adjustment part. By changing the resistance value in a great step by the coarse adjustment part and by changing the resistance value in a small step (resolution) by the fine adjustment part, it is made possible to make adjustment with a wide adjustment range and a small resolution. However, if the resistor part is formed by connecting the coarse adjustment part and the fine adjustment part in series in the gain-variable differential amplification circuit illustrated in FIG. 1A, it is not possible to arrange the resistor part symmetrically with respect to the differential pair. Because of this, when the resistance values of the coarse adjustment part and the fine adjustment part are adjusted, the symmetry with respect to the differential pair changes in each adjusted state, and a difference between the rise and the fall of an output signal is produced, and therefore, the difference changes in accordance with the adjustment as a result.

In the gain-variable differential amplification circuit of the embodiment illustrated in FIG. 2A, even if the resistance value of the fine adjustment part 12, the first coarse adjustment part 11A, and the second coarse adjustment part 11B is changed, the symmetrical state with respect to the differential pair is maintained. Similarly, in the gain-variable differential amplification circuit of the embodiment illustrated in FIG. 2B, even if the resistance value of the coarse adjustment part 21, the first fine adjustment part 22A, and the second fine adjustment part 22B is changed, the symmetrical state with respect to the differential pair is maintained. Because of this, it is possible to make adjustment with a wide adjustment range and a small resolution that are obtained by combining coarse adjustment and fine adjustment while maintaining the symmetry of the resistor part with respect to the differential pair.

Figure 3:
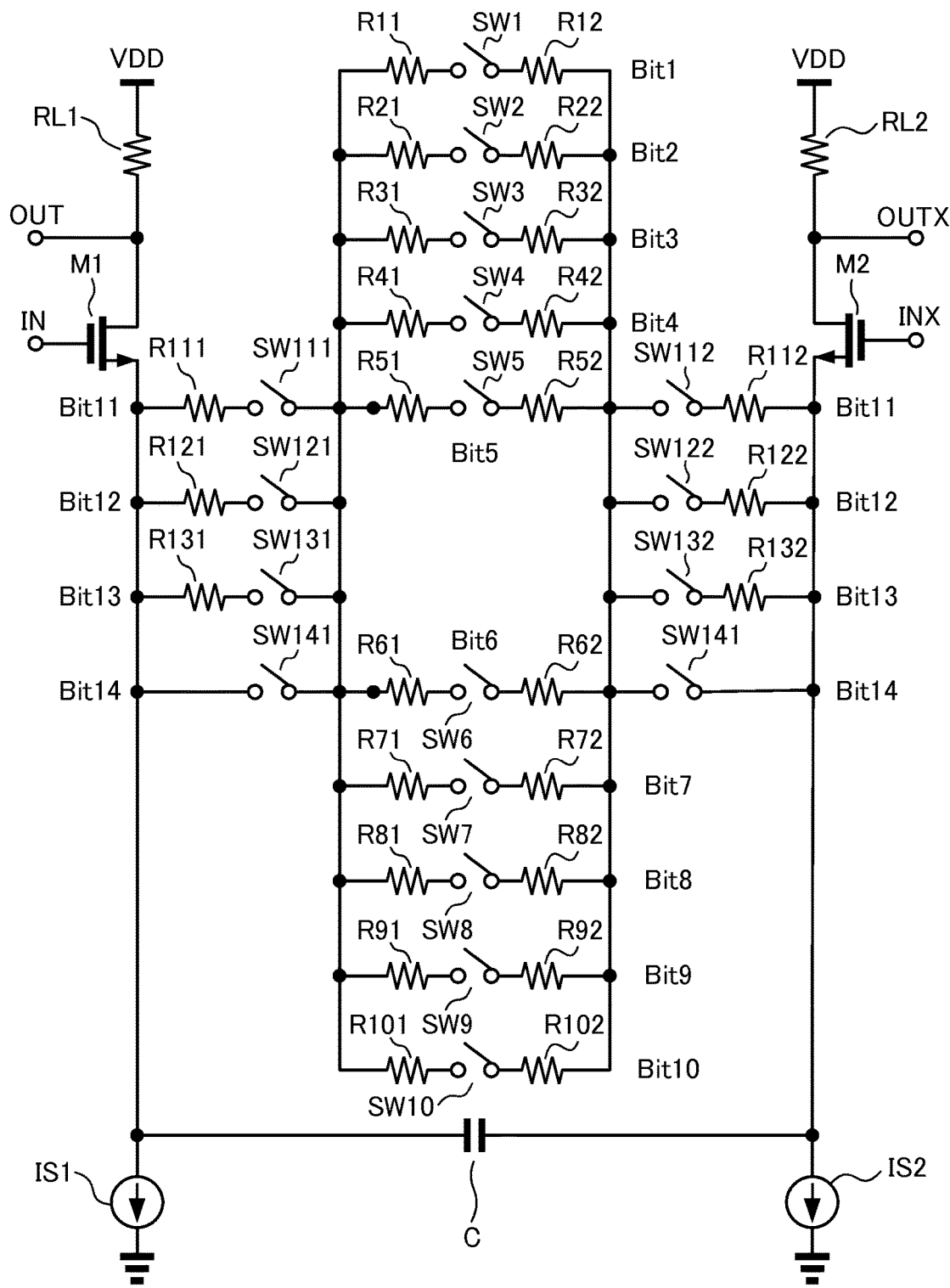
FIG. 3 illustrates an example of an embodied resistor part in the gain-variable differential amplification circuit of the embodiment illustrated in FIG. 2A as a gain-variable differential amplification circuit of a first embodiment.

FIG. 3 illustrates an example of an embodied resistor part in the gain-variable differential amplification circuit of the embodiment illustrated in FIG. 2A as a gain-variable differential amplification circuit of a first embodiment. The gain-variable differential amplification circuit of the first embodiment is the same as the gain-variable differential amplification circuit in FIG. 1A except for the resistor part.

In the gain-variable differential amplification circuit of the first embodiment, as illustrated in FIG. 2A, the fine adjustment part is located at the center, the first coarse adjustment part is connected to a first side (left side in FIG. 2A) of the fine adjustment part, and the second coarse adjustment part is connected to a second side (right side in FIG. 2A) of the fine adjustment part.

The fine adjustment part has first to tenth adjustment units that are connected in parallel. Each adjustment unit has a switch and two resistors having the same resistance value that are connected in series and the two resistors are connected to both sides of the switch. For example, in the first adjustment unit, a resistor R11, a switch SW11, and a resistor R12 are connected in series in this order, and the resistor R11 and the resistor R12 have an identical resistance value of VR1, and when the switch SW1 turns on (is brought into conduction), the resistance value of the first adjustment unit becomes 2VR1. Explanation is given by ignoring the resistances of the switch and a wire, but it may also be possible to take them into consideration. The circuit configurations of the other second to tenth adjustment units are similar to that of the first adjustment unit and the resistance value of the fine adjustment part becomes the resistance value when the resistors of the adjustment units in which the switches are on are connected in parallel. Consequently, each adjustment unit is symmetrical with respect to both ends and even if the state of the switches is changed, the fine adjustment part maintains the state symmetrical with respect to both ends, i.e., with respect to the first coarse adjustment part and the second coarse adjustment part.

The first coarse adjustment part has eleventh to fourteenth left adjustment units. Each left adjustment unit has a switch and one resistor that are connected in series. For example, in the eleventh left adjustment unit, a switch SW111 and a resistor R111 are connected in series, and the resistor R111 has a resistance value of VR11 and when the switch SW111 turns on, the resistance value of the eleventh left adjustment unit becomes VR11. The circuit configurations of the other twelfth and thirteenth left adjustment units are similar to that of the eleventh left adjustment unit. The fourteenth left adjustment unit has only a switch SW141. Consequently, when the switch SW141 turns on, the resistance of the fourteenth left adjustment unit becomes zero. The resistance value of the first coarse adjustment part is the resistance value when the resistors of the left adjustment units in which the switches are on are connected in parallel.

The second coarse adjustment part has eleventh to fourteenth right adjustment units. Each right adjustment unit has a switch and one resistor that are connected in series. For example, in the eleventh right adjustment unit, a switch SW112 and a resistor R112 are connected in series, and the resistor R112 has the resistance value VR11, and when the switch SW112 turns on, the resistance value of the eleventh right adjustment unit becomes VR11. The circuit configurations of the other twelfth and thirteenth right adjustment units are similar to that of the eleventh right adjustment unit. The fourteenth right adjustment unit has only a switch SW142. Consequently, when the switch SW142 turns on, the resistance of the fourteenth right adjustment unit becomes zero. The resistance value of the second coarse adjustment part is the resistance value when the resistors of the right adjustment units in which the switches are on are connected in parallel. As described above, the resistance value of the resistors of the left adjustment unit and the right adjustment unit corresponding to each other is the same.

As described above, the first coarse adjustment part and the second coarse adjustment part have the same circuit configuration and are connected symmetrically with respect to the fine adjustment part. Consequently, in the left adjustment unit, the switch may be connected to the source of M1 and in the right adjustment unit, the switch may be connected to the source of M2, respectively. Further, the switches of the left adjustment unit and the right adjustment unit corresponding to each other of the first coarse adjustment part and the second coarse adjustment part are turned on/off at the same time. Due to this, the first coarse adjustment part and the second coarse adjustment part maintain the state symmetrical with respect to the fine adjustment part even if the state of the switches is changed. Consequently, when the two switches of the left adjustment unit and the right adjustment unit corresponding to each other are turned on, the left adjustment unit and the right adjustment unit are connected to the fine adjustment part in series, and therefore, the left adjustment unit, the fine adjustment part, and the right adjustment unit contribute as a resistor having the resistance value including the resistance values of the two resistors included in the left adjustment unit and the right adjustment unit. In the following explanation, the switch operation is explained by regarding the switches of the left adjustment unit and the right adjustment unit as one switch. For example, SW111 and SW112 are turned on/off at the same time, and therefore, the expression that SW111 and SW112 are turned on/off is simplified to the expression that SW11 is turned on/off. This also applies to SW12 to SW14. Further, the resistance value of the left adjustment unit and the right adjustment unit is the resistance value, which is the sum of the resistance values of the two resistors, and therefore, there is a case where the resistance value, which is the sum of the resistance values of the two resistors, is referred to as the resistance value of the coarse adjustment unit.

FIG. 4A and FIG. 4B are diagrams illustrating ratios of the resistance value of each resistor and on/off selection of the switches in accordance with the gain adjustment code in the gain-variable differential amplification circuit of the first embodiment, and FIG. 4A illustrates ratios of the resistance value and FIG. 4B illustrates an on/off relationship between the gain adjustment code and the switches.

In FIG. 4A, SW denotes the switches SW1 to SW14 and Runit no. denotes resistance ratios of the adjustment unit including the corresponding switch. Here, the resistance value of the adjustment unit including SW11 and the resistance value of the adjustment unit including SW12 are taken to be "1" and the other resistance values are expressed by relative values. The larger the resistance values of the adjustment units including SW1 to SW10, the smaller the change in gain is because of the parallel connection. Similarly, the larger the resistance values of the adjustment units including SW11 to SW14, the smaller the change in gain is because of the parallel connection. The resistance values of the adjustment units including SW1 to SW10 and the resistance values of the adjustment units including SW11 to SW14 are added because of the serial connection. The resistance ratios in FIG. 4A are just an example and the resistance ratios are not limited to this example.

In FIG. 4B, Code/Bit denotes control data obtained by decoding the gain adjustment code and numbers put side by side in the transverse direction denote the numbers of the switches and it is indicated that the switch whose value in the table is "1" for the control data is turned on. The control data has adjustment levels in 20 steps. For example, in the case where the control data="11", SW1, SW11 (SW111, SW112), and SW12 (SW121, SW122) are turned on and the other switches are turned off.

FIG. 5A and FIG. 5B are diagrams illustrating $R_s$ in the previously-described expression and the change in the gain of the differential amplification circuit in the case where the resistance ratios illustrated in FIG. 4A and the switch on/off for the control data illustrated in FIG. 4B are applied to the gain-variable differential amplification circuit of the first embodiment. $R_s$ is expressed by relative values and the gain is expressed in units of dB.

$R_s$ changes for the control data as illustrated in FIG. 5A and in accordance with this, the gain of the circuit changes almost linearly in equal steps as illustrated in FIG. 5B. As described above, according to the first embodiment, it is possible to implement the necessary gain-variable widths with a small number of control data values (number of bits). In other words, if it is assumed that the gain step is, for example, 1 dB, in the circuit in FIG. 1A, the control data values require 20 bits in order to obtain gain-variable widths of 19 dB, but in the first embodiment, the same variable widths of 19 dB can be implemented by 14 bits. The area of the necessary resistors can also be reduced by 15%. Further, in the case where the number of pieces of necessary data (number of bits) increases, the effect becomes greater.

FIG. 6 is a diagram illustrating a circuit configuration of a semiconductor integrated circuit that includes the gain-variable differential amplification circuit of the first embodiment and which performs gain control.

This semiconductor integrated circuit has a control circuit 31, a decoder 32, and an amplification circuit 33 and the amplification circuit 33 is the gain-variable differential amplification circuit of the first embodiment. The control circuit 31 outputs gain adjustment Code <x:1> that controls the gain of the amplification circuit 33. Here, x=5. The decoder 32 receives gain adjustment Code <x:1> and outputs control data Bit <y:1>. In this case, y=14.

Figure 7:
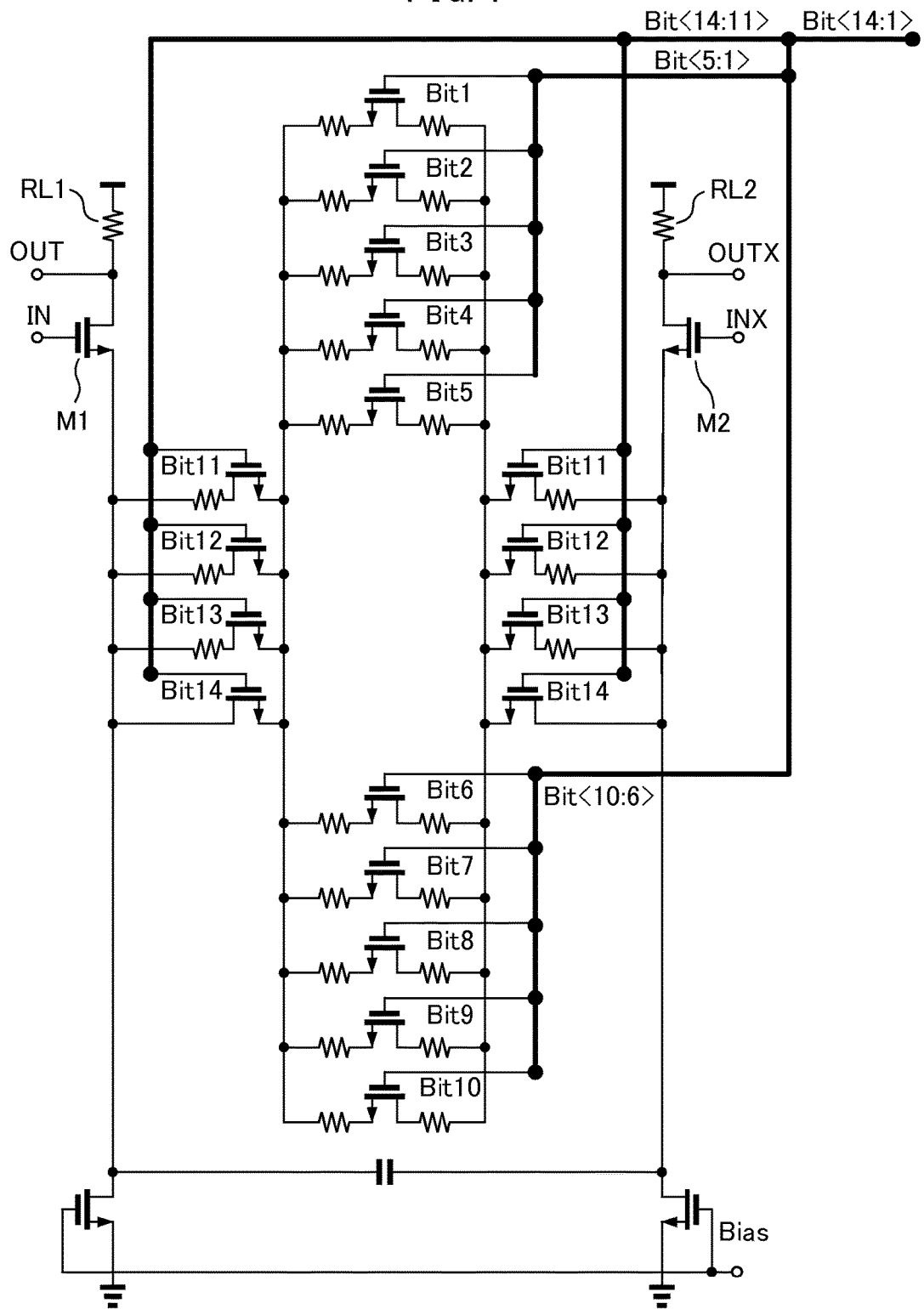
FIG. 7 is a diagram illustrating a circuit configuration of the amplification circuit.

FIG. 7 is a diagram illustrating a circuit configuration of the amplification circuit 33.

The amplification circuit 33 has the same circuit configuration as that of the gain-variable differential amplification circuit of the first embodiment illustrated in FIG. 3. In FIG. 7, the first current source IS1 and the second current source IS2 are implemented by a constant current circuit in which a bias voltage Bias is applied to the gate of a transistor. Bit <5:1>, which is from the decoder 32, of the control data Bit <14:1> is applied to the gates of SW1 to SW5, Bit <10:6> is applied to the gates of SW6 to SW10, and Bit <14:11> is applied to the gates of SW11 to SW14, respectively.

Figure 8:
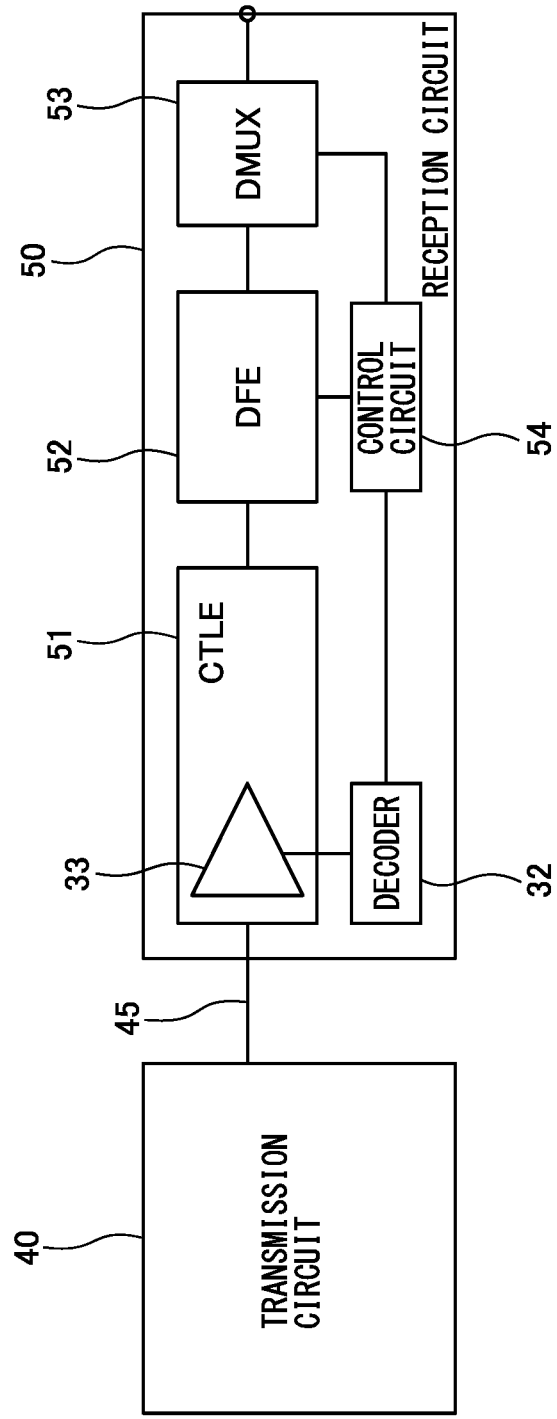
FIG. 8 is a diagram illustrating a configuration of a SERDES (Serializer-Deserializer) communication system which is used in the amplification circuit in the first stage of the reception circuit of the gain-variable differential amplification circuit of the first embodiment.

FIG. 8 is a diagram illustrating a configuration of a SERDES (Serializer-Deserializer) communication system that is used in the amplification circuit in the first stage of the reception circuit of the gain-variable differential amplification circuit of the first embodiment.

The communication system in FIG. 8 has a transmission circuit 40, a communication path 45, and a reception circuit 50. The transmission circuit 40 converts parallel data generated inside thereof into serial data and transmits the serial data to the reception circuit 50 through the communication path 45. The reception circuit 50 converts the received serial data into parallel data.

The reception circuit 50 has a CTLE (Continuous Time Linear Equalizer) 51, a DFE (Decision Feedback Equalizer) 52, a demultiplexer 53, a control circuit 54, and the decoder 32. In the CTLE 51, the amplification circuit 33 for controlling the frequency characteristics of an input signal is included. The CTLE 51 is feedback-controlled so as to compensate for the frequency characteristics of a signal output from a transmitter and deteriorated by the transmission characteristics. The control circuit 54 detects an error from the data restored by the demultiplexer 53 and gives feedback to the DFE 52 so as to reduce errors. The circuit configuration of the reception circuit as described above is widely known, and therefore, explanation is omitted.

The amplification circuit 33 is the gain-variable differential amplification circuit of the first embodiment and is controlled so as to be capable of performing favorable reception by controlling the frequency characteristics of a received signal. Specifically, the gain of the amplification circuit 33 is changed in accordance with the reception state. The control circuit 54 has a function to generate the gain adjustment code illustrated in FIG. 6 and generates the gain adjustment code based on the detected error rate and outputs the gain adjustment code to the decoder 32. The decoder 32 generates control data from the gain adjustment code and outputs the control data to the amplification circuit 33. The amplification circuit 33 changes the gain in accordance with the control data. Due to this, the gain of the amplification circuit 33 is controlled into a state of being capable of performing favorable reception. It may also be possible to generate the gain adjustment code based on an opening ratio, in place of the error rate, by detecting the opening ratio of an eye-pattern indicating the reception state.

As explained above, according to the differential amplification circuit of the embodiment, one of the coarse adjustment part and the fine adjustment part is divided into the first lateral adjustment part and the second lateral adjustment part that have the same circuit configuration, and therefore, it is possible to arrange the first lateral adjustment part and the second lateral adjustment part on both sides of the central adjustment part in a symmetrical manner. Because of this, it is possible to obtain a gain-variable differential amplification circuit with a comparatively wide gain adjustment range and small gain adjustment intervals by using a small number of switches while maintaining the symmetry of the output change.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A differential amplification circuit comprising:
a first transistor and a second transistor which form a differential pair;
a first load and a second load which are connected between drains of the first transistor and the second transistor, and one of power source lines, respectively;
current sources which are connected between sources of the first transistor and the second transistor, and the other of the power source lines, respectively; and
a resistor circuit which is connected between the sources of the first transistor and the second transistor, wherein
the resistor circuit includes:
a coarse adjustment part configured to change a resistance value of the resistor circuit in intervals equal to or greater than a first value; and
a fine adjustment part configured to change the resistance value of the resistor circuit in intervals equal to or less than a second value, the second value being smaller than the first value,
one of the coarse adjustment part and the fine adjustment part includes a first lateral adjustment part and a second lateral adjustment part which have the same circuit configuration,
one side of the first lateral adjustment part is connected to a central adjustment part, and the other side of the first lateral adjustment part is connected to the source of the first transistor,
one side of the second lateral adjustment part is connected to the central adjustment part, and the other side of the second lateral adjustment part is connected to the source of the second transistor,
the first lateral adjustment part and the second lateral adjustment part are symmetrically connected to both sides of the central adjustment part,
the central adjustment part is the other of the coarse adjustment part and the fine adjustment part,
the central adjustment part has a circuit configuration symmetrical with respect to two connection nodes with the first lateral adjustment part and the second lateral adjustment part,
the central adjustment part includes a plurality of central adjustment units which are connected in parallel, and
each of the central adjustment units includes a central switch and two central resistors which are connected to both sides of the central switch.
2. The differential amplification circuit according to claim 1, wherein
each of the first lateral adjustment part and the second lateral adjustment part includes a plurality of lateral adjustment units which are connected in parallel, each of the lateral adjustment units includes a lateral switch and a lateral resistor which is connected to the lateral switch, the lateral switches and the lateral resistors of the first lateral adjustment part and the second lateral adjustment part are arranged symmetrically with respect to the central adjustment part.

3. The differential amplification circuit according to claim 2, wherein, one of the lateral switches in the first lateral adjustment part and corresponding one of the lateral switches in the second lateral adjustment part are turned on or off at the same time.

4. The differential amplification circuit according to claim 1, wherein each of the first lateral adjustment part and the second lateral adjustment part includes a plurality of lateral adjustment units which are connected in parallel, each lateral adjustment unit includes a lateral switch and a lateral resistor which is connected to the lateral switch, the lateral switches and the lateral resistors of the first lateral adjustment part and the second lateral adjustment part are arranged symmetrically with respect to the central adjustment part.

5. The differential amplification circuit according to claim 4, wherein, one of the lateral switches in the first lateral adjustment part and corresponding one of the lateral switches in the second lateral adjustment part are turned on or off at the same time.

6. A semiconductor integrated circuit comprising:

a differential amplification circuit, the gain of which changes in accordance with control data;

a control circuit configured to output a gain adjustment code of the differential amplification circuit; and a decoder configured to convert the gain adjustment code into the control data and to apply the control data to the differential amplification circuit, the differential amplification circuit includes:

a first transistor and a second transistor which form a differential pair;

a first load and a second load which are connected between drains of the first transistor and the second transistor, and one of power source lines, respectively;

current sources which are connected between sources of the first transistor and the second transistor, and the other of the power source lines, respectively; and a resistor circuit which is connected between the sources of the first transistor and the second transistor, wherein the resistor circuit includes:

a coarse adjustment part configured to change a resistance value of the resistor circuit in intervals equal to or greater than a first value; and a fine adjustment part configured to change the resistance value of the resistor circuit in intervals equal to or less than a second value, the second value being smaller than the first value, one of the coarse adjustment part and the fine adjustment part includes a first lateral adjustment part and a second lateral adjustment part which have the same circuit configuration, one side of the first lateral adjustment part is connected to a central adjustment part, and the other side of the first lateral adjustment part is connected to the source of the first transistor, one side of the second lateral adjustment part is connected to the central adjustment part, and the other side of the second lateral adjustment part is connected to the source of the second transistor, the first lateral adjustment part and the second lateral adjustment part are symmetrically connected to both sides of the central adjustment part, the central adjustment part is the other of the coarse adjustment part and the fine adjustment part, the central adjustment part has a circuit configuration symmetrical with respect to two connection nodes with the first lateral adjustment part and the second lateral adjustment part, the central adjustment part includes a plurality of central adjustment units which are connected in parallel, and each of the central adjustment units includes a central switch and two central resistors which are connected to both sides of the central switch.

7. The semiconductor integrated circuit according to claim 6, wherein each of the first lateral adjustment part and the second lateral adjustment part includes a plurality of lateral adjustment units which are connected in parallel, each of the lateral adjustment units includes a lateral switch and a lateral resistor which is connected to the lateral switch, the lateral switches and the lateral resistors of the first lateral adjustment part and the second lateral adjustment part are arranged symmetrically with respect to the central adjustment part.

8. The semiconductor integrated circuit according to claim 7, wherein one of the lateral switches in the first lateral adjustment part and corresponding one of the lateral switches in the second lateral adjustment part are turned on or off at the same time.

9. The semiconductor integrated circuit according to claim 6, wherein each of the first lateral adjustment part and the second lateral adjustment part includes a plurality of lateral adjustment units which are connected in parallel, each of the lateral adjustment units includes a lateral switch and a lateral resistor which is connected to the lateral switch, the lateral switches and the lateral resistors of the first lateral adjustment part and the second lateral adjustment part are arranged symmetrically with respect to the central adjustment part.

10. The semiconductor integrated circuit according to claim 9, wherein, one of the lateral switches in the first lateral adjustment part and corresponding one of the lateral switches in the second lateral adjustment part are turned on or off at the same time.

11. A differential amplification circuit comprising:

a first transistor and a second transistor which form a differential pair;

a first load and a second load which are connected between drains of the first transistor and the second transistor, and one of power source lines, respectively;

current sources which are connected between sources of the first transistor and the second transistor, and the other of the power source lines, respectively; and a resistor circuit which is connected between the sources of the first transistor and the second transistor, wherein the resistor circuit includes:

a coarse adjustment part configured to change a resistance value of the resistor circuit in intervals equal to or greater than a first value; and a fine adjustment part configured to change the resistance value of the resistor circuit in intervals equal to or less than a second value, the second value being smaller than the first value, one of the coarse adjustment part and the fine adjustment part includes a first lateral adjustment part and a second lateral adjustment part which have the same circuit configuration, one side of the first lateral adjustment part is connected to a central adjustment part, and the other side of the first lateral adjustment part is connected to the source of the first transistor, one side of the second lateral adjustment part is connected to the central adjustment part, and the other side of the second lateral adjustment part is connected to the source of the second transistor, the first lateral adjustment part and the second lateral adjustment part are symmetrically connected to both sides of the central adjustment part, the central adjustment part is the other of the coarse adjustment part and the fine adjustment part, the central adjustment part has a circuit configuration symmetrical with respect to two connection nodes with the first lateral adjustment part and the second lateral adjustment part, each of the first lateral adjustment part and the second lateral adjustment part includes a plurality of lateral adjustment units which are connected in parallel, each of the lateral adjustment units includes a lateral switch and a lateral resistor which is connected to the lateral switch, and the lateral switches and the lateral resistors of the first lateral adjustment part and the second lateral adjustment part are arranged symmetrically with respect to the central adjustment part.

12. The differential amplification circuit according to claim 11, wherein one of the lateral switches in the first lateral adjustment part and corresponding one of the lateral switches in the second lateral adjustment part are turned on or off at the same time.

13. A semiconductor integrated circuit comprising:

a differential amplification circuit, the gain of which changes in accordance with control data;

a control circuit configured to output a gain adjustment code of the differential amplification circuit; and a decoder configured to convert the gain adjustment code into the control data and to apply the control data to the differential amplification circuit, the differential amplification circuit includes:

a first transistor and a second transistor which form a differential pair;

a first load and a second load which are connected between drains of the first transistor and the second transistor, and one of power source lines, respectively;

current sources which are connected between sources of the first transistor and the second transistor, and the other of the power source lines, respectively; and a resistor circuit which is connected between the sources of the first transistor and the second transistor, wherein the resistor circuit includes:

a coarse adjustment part configured to change a resistance value of the resistor circuit in intervals equal to or greater than a first value; and a fine adjustment part configured to change the resistance value of the resistor circuit in intervals equal to or less than a second value, the second value being smaller than the first value, one of the coarse adjustment part and the fine adjustment part includes a first lateral adjustment part and a second lateral adjustment part which have the same circuit configuration, one side of the first lateral adjustment part is connected to a central adjustment part, and the other side of the first lateral adjustment part is connected to the source of the first transistor, one side of the second lateral adjustment part is connected to the central adjustment part, and the other side of the second lateral adjustment part is connected to the source of the second transistor, the first lateral adjustment part and the second lateral adjustment part are symmetrically connected to both sides of the central adjustment part, the central adjustment part is the other of the coarse adjustment part and the fine adjustment part, the central adjustment part has a circuit configuration symmetrical with respect to two connection nodes with the first lateral adjustment part and the second lateral adjustment part, each of the first lateral adjustment part and the second lateral adjustment part includes a plurality of lateral adjustment units which are connected in parallel, each of the lateral adjustment units includes a lateral switch and a lateral resistor which is connected to the lateral switch, and the lateral switches and the lateral resistors of the first lateral adjustment part and the second lateral adjustment part are arranged symmetrically with respect to the central adjustment part.

14. The semiconductor integrated circuit according to claim 13, wherein one of the lateral switches in the first lateral adjustment part and corresponding one of the lateral switches in the second lateral adjustment part are turned on or off at the same time.

* * * * *